(12) United States Patent
Zhu et al.

(10) Patent No.: US 11,784,277 B2
(45) Date of Patent: Oct. 10, 2023

(54) METHOD FOR PREPARING P-TYPE CRYSTALLINE SILICON REAR ELECTRODE

(71) Applicant: NANTONG T-SUN NEW ENERGY CO., LTD., Nantong (CN)

(72) Inventors: Peng Zhu, Nantong (CN); Guizhong Yang, Nantong (CN); Yanmei Chen, Nantong (CN); Yeqing Wang, Nantong (CN)

(73) Assignee: NANTONG T-SUN NEW ENERGY CO., LTD., Nantong (CN)

( * ) Notice: Subject to any disclaimer, the term of this patent is extended or adjusted under 35 U.S.C. 154(b) by 182 days.

(21) Appl. No.: 17/431,387

(22) PCT Filed: Jul. 12, 2019

(86) PCT No.: PCT/CN2019/095752
§ 371 (c)(1),
(2) Date: Aug. 16, 2021

(87) PCT Pub. No.: WO2020/252827
PCT Pub. Date: Dec. 24, 2020

(65) Prior Publication Data
US 2022/0115553 A1    Apr. 14, 2022

(30) Foreign Application Priority Data
Jun. 19, 2019 (CN) .......................... 201910529082.1

(51) Int. Cl.
*H01L 31/18* (2006.01)
*H01L 31/0224* (2006.01)

(52) U.S. Cl.
CPC .... *H01L 31/182* (2013.01); *H01L 31/022483* (2013.01)

(58) Field of Classification Search
CPC .............. H01L 31/182; H01L 31/1868; H01L 31/0224; H01L 31/022483; H01L 31/022466
See application file for complete search history.

(56) References Cited

U.S. PATENT DOCUMENTS

2017/0278986 A1* 9/2017 Lee ................... H01L 31/02013
2021/0391482 A1* 12/2021 Zhu ........................... C09D 7/20

FOREIGN PATENT DOCUMENTS

CN      106711239 A   *  5/2017  ............... C09D 5/24

OTHER PUBLICATIONS

Machine translation of CN-106711239-A, Cheng. (Year: 2017).*

* cited by examiner

*Primary Examiner* — Mayla Gonzalez Ramos
(74) *Attorney, Agent, or Firm* — CBM PATENT CONSULTING, LLC

(57) ABSTRACT

A method for preparing a P-type crystalline silicon rear electrode, comprising: printing an all-aluminum paste on a P-type crystalline silicon rear passivation layer, then printing a linear interlayer-glass paste on the all-aluminum paste, and finally overprinting rear silver electrodes on the linear middle layer-glass paste. In a solar cell prepared using the method, good contact with silver and aluminum is kept without causing damage to the passivation layer and compromising the conductivity. In the present invention, a complete all-aluminum back surface field can be formed, leading to an improved field passivation property of an electrode region and reduced carrier recombination.

10 Claims, No Drawings

METHOD FOR PREPARING P-TYPE CRYSTALLINE SILICON REAR ELECTRODE

TECHNICAL FIELD

The present invention relates to the field of solar cells and, in particular, to a method for preparing a P-type crystalline silicon rear electrode.

BACKGROUND

With the rapid development of modern industry, the natural energy resources such as petroleum, coal and natural gas on the earth are gradually depleted, and the subsequent energy crisis, greenhouse effect and environmental pollution are increasingly serious, which poses the need for seeking novel clean energy resources capable of replacing the natural energy resources. The sun has become an effective provider of novel energy sources. Solar energy can be converted into electric energy by solar cells, which is the most direct way to convert solar energy with the least steps among all the methods for utilizing clean energy sources.

Solar cells available on the market are mainly crystalline silicon solar cells at present, and in consideration of technical maturity, photoelectric conversion efficiency, sources of starting materials and the like, silicon solar cells will remain the main focus of development of photovoltaic solar cells for a long time in the future. Therefore, how to further improve the photoelectric conversion efficiency of crystalline silicon solar cells is one of the continuous pursuits in the industry.

Aluminum back surface field (BSF) is a typical back surface passivation structure commonly employed in modern crystalline silicon solar cells. After years of development, the production process of the aluminum back surface field gradually tends to be mature and stable, and various studies on the aluminum back surface field are increasingly deepened. All those above indicate that the aluminum back surface field will remain to be widely used for crystalline silicon solar cells in a long time in the future and to be a major contribution to improving the conversion efficiency of cells.

Therefore, the preparation process flow of a conventional crystalline silicon solar cell at present comprises performing diffusion on the starting material, a silicon die, to prepare p-n junctions after pre-cleaning and texturing, removing the phosphorosilicate glass (PSG) layer by etching, plating an anti-reflection coating to give a blue film plate by PECVD, printing a rear silver paste to prepare rear silver electrodes by screen printing, printing a rear aluminum paste to prepare the aluminum back surface field after drying, printing a front silver paste to prepare front silver electrodes after drying, and sintering at high temperature for a short time after drying to give a cell plate.

In addition to properties of good printing performance and a low silver content required for a conventional crystalline silicon cell rear silver paste, the requirements of the PERC cell on the PERC rear silver paste further comprise the following: (1) low activity to reduce the reaction of the glass powder with the passivation coating, to prevent a large number of recombination centers from forming at the place where the silver paste contacts with the silicon die, and to improve the open-circuit voltage; (2) a wide process window suitable for the low temperature-sintering process; and (3) excellent adhesion and aging adhesion.

In the PERC cell, the rear silver paste serves primarily as a simple bulbar and welding joint, and does not make contact with silicon. The rear silver paste being directly printed on the aluminum paste may bring two problems, one of which is that the mutual contact between silver and aluminum will affect the welding performance of the rear electrode, and the other one of which is that the edge of the back electrode needs to be covered by the aluminum back surface field, increasing the width of the rear electrode and thus the cost of the rear electrode paste.

SUMMARY

Purpose: In order to solve the defects in the prior art, the present invention provides a method for preparing a P-type crystalline silicon rear electrode, and the specific invention content is as follows:

Technical Scheme: The present invention is intended to provide a method for preparing a P-type crystalline silicon rear electrode, comprising performing double-sided texturing on a P-type crystalline silicon, plating a film on a front of the P-type crystalline silicon, plating a rear passivation layer on a rear of the P-type crystalline silicon, grooving on the rear passivation layer, and then preparing front and rear electrodes for the P-type crystalline silicon, wherein preparing the rear electrode comprises:

(1) printing an all-aluminum paste on the rear passivation layer and drying, then printing the all-aluminum paste on the P-type crystalline silicon rear passivation layer and drying at 150-250° C. for 2.5-3.5 min, and printing a layer of a linear interlayer-glass paste at the position of the rear electrode and drying at 150-250° C. for 2.5-3.5 min, wherein the linear interlayer-glass paste layer has a width of 0.6-2 mm, a height of 2-5 μm, and a distance of 13-30.4 mm between two adjacent linear interlayer-glass pastes; and (2) overprinting rear silver electrodes on the linear interlayer-glass paste in step (1), and drying at 150-250° C. for 1-2 min to give the P-type crystalline silicon rear electrodes, wherein the rear silver electrode has a width of 0.6-2 mm, a height of 3-8 μm, and a distance of 13-30.4 mm between two adjacent rear electrodes.

In some embodiments of the present invention, the linear interlayer-glass paste in step (1) is prepared by mixing a bismuth-boron-zinc-vanadium glass powder and an organic vehicle; based on 100 wt % of the linear interlayer-glass paste, the weight of the bismuth-boron-zinc-vanadium glass powder is 30-50%, and the weight of the organic vehicle is 50-70%.

In some embodiments of the present invention, based on 100 wt % of the bismuth-boron-zinc-vanadium glass powder, the bismuth-boron-zinc-vanadium glass powder is prepared by fusion of 10-40 wt % of bismuth oxide, 5-25 wt % of boron oxide, 5-25 wt % of zinc oxide, 10-35 wt % of vanadium oxide, 4-8 wt % of strontium carbonate and 0-4 wt % of gallium oxide.

In some embodiments of the present invention, the bismuth-boron-zinc-vanadium glass powder has a vitrification transition temperature of 300-400° C. and a median particle size $D_{50}$ of 2-3 μm.

In some embodiments of the present invention, based on 100 wt % of the organic vehicle, the organic vehicle comprises 10-30 wt % of an organic resin, 60-80 wt % of an organic solvent and 5-15 wt % of an organic auxiliary agent.

In some embodiments of the present invention, the organic resin is at least one selected from ethyl cellulose and butyl acetate cellulose.

In some embodiments of the present invention, the organic solvent is one or more selected from terpineol, texanol, butyl carbitol, butyl carbitol acetate and glycerol.

In some embodiments of the present invention, the organic auxiliary agent is at least one selected from stearic acid and a stearic acid derivative, an unsaturated fatty acid, a modified hydrogenated castor oil and a polyamide wax.

In some embodiments of the present invention, the rear silver electrode in step (2) is prepared by mixing, grinding and dispersing a flake silver powder, a lead-boron-zinc-barium glass powder and an organic vehicle; based on 100 wt % of the rear silver electrode, the weight of the flake silver powder is 60-80 wt %, the weight of the lead-boron-zinc-barium glass powder is 10-15 wt %, and the weight of the organic vehicle is 5-20 wt %; the flake silver powder has a median particle size $D_{50}$ of 5-6 μm, and the lead-boron-zinc-barium glass powder has a vitrification transition temperature of 350-450° C. and a median particle size $D_{50}$ of the lead-boron-zinc-barium glass powder is 0.5-1 μm.

In some embodiments of the present invention, based on 100 wt % of the lead-boron-zinc-barium glass powder, the lead-boron-zinc-barium glass powder is prepared by fusion of 50-60 wt % of lead oxide, 10-30 wt % of boron oxide, 5-20 wt % of zinc oxide and 1-10 wt % of barium oxide.

Beneficial Effects: The present invention has the following advantages:

The rear electrode of the present invention is prepared by first printing a layer of a linear interlayer-glass paste and then overprinting a layer of silver electrodes on the linear interlayer-glass paste. The layer of the linear interlayer-glass paste printed can prevent silver and aluminum from mutually permeating; the linear interlayer-glass paste has good adhesion to a silver layer and a aluminum layer; the linear interlayer-glass paste has a low melting point, and can permeate into the aluminum paste to provide tension; the linear interlayer-glass paste disclosed herein does not cause damage to the passivation layer, makes good contact with silver and aluminum, and does not affect the conductivity.

In the present invention, the glass powder for preparing the linear interlayer-glass paste has a good leveling property, and can effectively prevent silver from permeating into aluminum paste in the process of sintering rear electrodes at 400° C. In addition, the glass further has good capacity to facilitate sintering of aluminum powder, and can enable the glass paste to cover the aluminum paste below for compact sintering, leading to effectively reduced resistance and good tension provided.

In the preparation of rear electrodes by using the method disclosed herein, a complete all-aluminum back surface field can be formed, leading to an improved field passivation property of electrode regions and reduced carrier recombination. Besides, no silver entering a silicon substrate avoids electric leakage, thereby reducing leakage current in cells and improving the photoelectric conversion efficiency.

Compared to a conventional method, the method for preparing a P-type crystalline silicon rear electrode disclosed herein needs no overprinting, which can reduce the width of an electrode and thus the costs.

DETAILED DESCRIPTION

The technical schemes in the embodiments of the present invention will be clearly and completely described below, for a better understanding of the advantages and features of the present invention by those skilled in the art, and for a more the clearly defined protection scope of the present invention. The described embodiments are only some, but not all, embodiments of the invention. Based on the embodiments of the present invention, all other embodiments obtained by those of ordinary skill in the art without making any creative effort will fall within the protection scope of the present invention.

Example 1

1. Preparation of Linear Interlayer-Glass Paste

Preparation of bismuth-boron-zinc-vanadium glass powder: based on 100 wt % of the bismuth-boron-zinc-vanadium glass powder, 25 wt % of bismuth oxide, 20 wt % of boron oxide, 20 wt % of zinc oxide, 27 wt % of vanadium oxide, 6 wt % of strontium carbonate and 2 wt % of gallium oxide were well mixed using a known mixer such as a disperser or a three-roll mill, and dried for 3.5 h before being transferred into a crucible. The crucible containing the starting materials was first heated to 950° C. in a heating chamber, and then incubated for 1.5 h. The resultant liquid of the smelted materials was allowed to pass through a cooling roller to give a bismuth-boron-zinc-vanadium glass powder, which was then crushed and sieved to give the bismuth-boron-zinc-vanadium glass powder having a median particle size $D_{50}$ of 2.5 μm and a vitrification transition temperature of 350° C.

Preparation of interlayer-glass paste: based on 100 wt % of the linear interlayer-glass paste, 40 wt % of the bismuth-boron-zinc-vanadium glass powder, 12 wt % of ethyl cellulose, 21 wt % of terpineol, 21 wt % of texanol, 3 wt % of an unsaturated fatty acid and 3 wt % of a modified hydrogenated castor oil were well mixed before being ground and dispersed to give the interlayer-glass paste.

2. Preparation of Silver Paste Used in Combination with Linear Interlayer-Glass Paste Preparation of lead-boron-zinc-barium glass powder: based on 100 wt % of the lead-boron-zinc-barium glass powder, 55 wt % of lead oxide, 20 wt % of boron oxide, 20 wt % of zinc oxide and 5 wt % of barium oxide were mixed using a known mixer such as a disperser or a three-roller mill, and dried for 3.5 h before being transferred into a crucible. The crucible containing the starting materials was first heated to 950° C. in a heating chamber, and then incubated for 1.5 h. The resultant liquid of the smelted materials was allowed to pass through a cooling roller to give a lead-boron-zinc-barium glass powder, which was then crushed and sieved to give the lead-boron-zinc-barium glass powder having a median particle size $D_{50}$ of 0.8 μm and a vitrification transition temperature of 400° C.

Preparation of silver paste: based on 100 wt % of the rear silver electrode, 70 wt % of a flake silver powder, 12.5 wt % of the lead-boron-zinc-barium glass powder (glass in the silver paste is not the same as that in the middle layer) and 17.5 wt % of an organic vehicle were weighed, wherein the median particle diameter $D_{50}$ of the flake silver powder is 5.5 μm, and well mixed before being ground and dispersed to give the silver paste used in combination with the linear interlayer-glass paste.

3. Preparation of P-Type Crystalline Silicon Rear Electrode

Provided is a method for preparing a P-type crystalline silicon back electrode, comprising the following specific steps:

metallization of the rear electrode was performed by using the low temperature-sintering rear silver paste prepared above. Double-sided texturing was first performed on the front and the rear of a P-type crystalline silicon by using acid or base;

a silicon nitride anti-reflection passivation coating was then formed on the front of the P-type crystalline silicon;

a rear passivation layer was then plated on the rear of the P-type crystalline silicon, and by using $SiN_x$ or $Al_2O_3$ a passivation layer was formed on the rear of the cell as a rear reflector for increasing absorption of long wave light and for maximizing the potential difference between P-N electrodes to reduce electron recombination, so as to improve the conversion efficiency of the cell;

grooving was then performed on the rear passivation layer, and prior to metallization, coating opening following a specific pattern was performed on the rear passivation coating by using laser to remove part of the passivation layer; by using such local point contact mode, the electrode contact area and thus the electrode recombination could be reduced;

the front and the rear of the P-type crystalline silicon were then metallized separately, wherein the metallization of the rear of the P-type crystalline silicon comprised the following steps:

double-sided texturing on a P-type crystalline silicon was performed, a film was plated on a front of the P-type crystalline silicon, a rear passivation layer was plated on a rear of the P-type crystalline silicon, grooving was performed on the rear passivation layer, and then front and rear electrodes were prepared for the P-type crystalline silicon, wherein the method for preparing the rear electrode comprised:

(1) an all-aluminum paste was printed on the rear passivation layer and dried, then the all-aluminum paste was printed on the P-type crystalline silicon rear passivation layer and dried at 200° C. for 3 min, and a layer of a linear interlayer-glass paste was at the position of the rear electrode and dried at 200° C. for 3 min, wherein the linear interlayer-glass paste layer has a width of 1 mm, a height of 15 μm, and a distance of 22 mm between two adjacent linear interlayer-glass pastes; and (2) rear silver electrodes were overprinted on the linear interlayer-glass paste in step (1), and sintered at 200° C. for 1.5 s to give the P-type crystalline silicon rear electrodes, wherein the rear silver electrode has a width of 1 mm, a height of 5.5 μm, and a distance of 22 mm between two adjacent rear electrodes.

Example 2

1. Preparation of Linear Interlayer-Glass Paste

Preparation of bismuth-boron-zinc-vanadium glass powder: based on 100 wt % of the bismuth-boron-zinc-vanadium glass powder, 40 wt % of bismuth oxide, 15 wt % of boron oxide, 15 wt % of zinc oxide, 24 wt % of vanadium oxide and 6 wt % of strontium carbonate were well mixed using a known mixer such as a disperser or a three-roll mill, and dried for 4 h before being transferred into a crucible. The crucible containing the starting materials was first heated to 1050° C. in a heating chamber, and then incubated for 2 h. The resultant liquid of the smelted materials was allowed to pass through a cooling roller to give a bismuth-boron-zinc-vanadium glass powder, which was then crushed and sieved to give the bismuth-boron-zinc-vanadium glass powder having a median particle size $D_{50}$ of 2 μm and a vitrification transition temperature of 300° C.

Preparation of interlayer-glass paste: based on 100 wt % of the linear interlayer-glass paste, 30 wt % of the bismuth-boron-zinc-vanadium glass powder, 7 wt % of butyl acetate cellulose, 28 wt % of butyl carbitol, 28 wt % of butyl carbitol acetate, 4 wt % of a polyamide wax and 3 wt % of a modified hydrogenated castor oil were well mixed before being ground and dispersed to give the interlayer-glass paste.

2. Preparation of Silver Paste Used in Combination with Linear Interlayer-Glass Paste Preparation of lead-boron-zinc-barium glass powder: based on 100 wt % of the lead-boron-zinc-barium glass powder, 60 wt % of lead oxide, 15 wt % of boron oxide, 15 wt % of zinc oxide and 10 wt % of barium oxide were mixed using a known mixer such as a disperser or a three-roller mill, and dried for 3 h before being transferred into a crucible. The crucible containing the starting materials was first heated to 1050° C. in a heating chamber, and then incubated for 1 h. The resultant liquid of the smelted materials was allowed to pass through a cooling roller to give a lead-boron-zinc-barium glass powder, which was then crushed and sieved to give the lead-boron-zinc-barium glass powder having a median particle size $D_{50}$ of 1 μm and a vitrification transition temperature of 350° C.

Preparation of silver paste: based on 100 wt % of the rear silver electrode, 80 wt % of a flake silver powder, 15 wt % of the lead-boron-zinc-barium glass powder and 5 wt % of an organic vehicle were weighed, wherein the median particle diameter $D_{50}$ of the flake silver powder is 5 μm, and well mixed before being ground and dispersed to give the silver paste used in combination with the linear interlayer-glass paste.

3. Preparation of P-Type Crystalline Silicon Rear Electrode

Provided is a method for preparing a P-type crystalline silicon back electrode, comprising the following specific steps:

metallization of the rear electrode was performed by using the low temperature-sintering rear silver paste prepared above. Double-sided texturing was first performed on the front and the rear of a P-type crystalline silicon by using acid or base;

a silicon nitride anti-reflection passivation coating was then formed on the front of the P-type crystalline silicon;

a rear passivation layer was then plated on the rear of the P-type crystalline silicon, and by using $SiN_x$ or $Al_2O_3$ a passivation layer was formed on the rear of the cell as a rear reflector for increasing absorption of long wave light and for maximizing the potential difference between P-N electrodes to reduce electron recombination, so as to improve the conversion efficiency of the cell;

grooving was then performed on the rear passivation layer, and prior to metallization, coating opening following a specific pattern was performed on the rear passivation coating by using laser to remove part of the passivation layer; by using such local point contact mode, the electrode contact area and thus the electrode recombination could be reduced;

the front and the rear of the P-type crystalline silicon were then metallized separately, wherein the metallization of the rear of the P-type crystalline silicon comprised the following steps:

double-sided texturing on a P-type crystalline silicon was performed, a film was plated on a front of the P-type crystalline silicon, a rear passivation layer was plated on a rear of the P-type crystalline silicon, grooving was performed on the rear passivation layer, and then front and rear electrodes were prepared for the P-type crystalline silicon, wherein the method for preparing the rear electrode comprised:

(1) an all-aluminum paste was printed on the rear passivation layer and dried, then the all-aluminum paste was printed on the P-type crystalline silicon rear passivation layer and dried at 150° C. for 3.5 min, and a layer of a linear interlayer-glass paste was at the position of the rear electrode and dried at 150° C. for 3.5 min, wherein the linear interlayer-glass paste layer has a width of 0.6 mm, a height of 2 μm, and a distance of 13 mm between two adjacent linear interlayer-glass pastes; and (2) rear silver electrodes were overprinted on the linear interlayer-glass paste in step (1), and dried at 150° C. for 2 min to give the P-type crystalline silicon rear electrodes, wherein the rear silver electrode has a width of 0.6 mm, a height of 3 μm, and a distance of 13 mm between two adjacent rear electrodes.

Example 3

1. Preparation of Linear Interlayer-Glass Paste

Preparation of bismuth-boron-zinc-vanadium glass powder: based on 100 wt % of the bismuth-boron-zinc-vanadium glass powder, 10 wt % of bismuth oxide, 25 wt % of boron oxide, 21 wt % of zinc oxide, 32 wt % of vanadium oxide, 8 wt % of strontium carbonate and 4 wt % of gallium oxide were well mixed using a known mixer such as a disperser or a three-roll mill, and dried for 4 h before being transferred into a crucible. The crucible containing the starting materials was first heated to 850° C. in a heating chamber, and then incubated for 2 h. The resultant liquid of the smelted materials was allowed to pass through a cooling roller to give a bismuth-boron-zinc-vanadium glass powder, which was then crushed and sieved to give the bismuth-boron-zinc-vanadium glass powder having a median particle size $D_{50}$ of 3 μm and a vitrification transition temperature of 400° C.

Preparation of interlayer-glass paste: based on 100 wt % of the linear interlayer-glass paste, 50 wt % of the bismuth-boron-zinc-vanadium glass powder, 7 wt % of ethyl cellulose, 8 wt % of butyl acetate cellulose, 15 wt % of glycerol, 15 wt % of texanol, 2 wt % of polyamide wax and 3 wt % of butyl carbitol acetate were well mixed before being ground and dispersed to give the interlayer-glass paste.

2. Preparation of Silver Paste Used in Combination with Linear Interlayer-Glass Paste Preparation of lead-boron-zinc-barium glass powder: based on 100 wt % of the lead-boron-zinc-barium glass powder, 60 wt % of lead oxide, 20 wt % of boron oxide, 15 wt % of zinc oxide and 5 wt % of barium oxide were mixed using a known mixer such as a disperser or a three-roller mill, and dried for 3 h before being transferred into a crucible. The crucible containing the starting materials was first heated to 1050° C. in a heating chamber, and then incubated for 1 h. The resultant liquid of the smelted materials was allowed to pass through a cooling roller to give a lead-boron-zinc-barium glass powder, which was then crushed and sieved to give the lead-boron-zinc-barium glass powder having a median particle size $D_{50}$ of 0.5 μm and a vitrification transition temperature of 350° C.

Preparation of silver paste: based on 100 wt % of the rear silver electrode, 80 wt % of a flake silver powder, 10 wt % of the lead-boron-zinc-barium glass powder and 10 wt % of an organic vehicle were weighed, wherein the median particle diameter $D_{50}$ of the flake silver powder is 6 μm, and well mixed before being ground and dispersed to give the silver paste used in combination with the linear interlayer-glass paste.

3. Preparation of P-Type Crystalline Silicon Rear Electrode

Provided is a method for preparing a P-type crystalline silicon back electrode, comprising the following specific steps:

metallization of the rear electrode was performed by using the low temperature-sintering rear silver paste prepared above. Double-sided texturing was first performed on the front and the rear of a P-type crystalline silicon by using acid or base;

a silicon nitride anti-reflection passivation coating was then formed on the front of the P-type crystalline silicon;

a rear passivation layer was then plated on the rear of the P-type crystalline silicon, and by using $SiN_x$ or $Al_2O_3$ a passivation layer was formed on the rear of the cell as a rear reflector for increasing absorption of long wave light and for maximizing the potential difference between P-N electrodes to reduce electron recombination, so as to improve the conversion efficiency of the cell;

grooving was then performed on the rear passivation layer, and prior to metallization, coating opening following a specific pattern was performed on the rear passivation coating by using laser to remove part of the passivation layer; by using such local point contact mode, the electrode contact area and thus the electrode recombination could be reduced;

the front and the rear of the P-type crystalline silicon were then metallized separately, wherein the metallization of the rear of the P-type crystalline silicon comprised the following steps:

double-sided texturing on a P-type crystalline silicon was performed, a film was plated on a front of the P-type crystalline silicon, a rear passivation layer was plated on a rear of the P-type crystalline silicon, grooving was performed on the rear passivation layer, and then front and rear electrodes were prepared for the P-type crystalline silicon, wherein the method for preparing the rear electrode comprised:

(1) an all-aluminum paste was printed on the rear passivation layer and dried, then the all-aluminum paste was printed on the P-type crystalline silicon rear passivation layer and dried at 250° C. for 2.5 min, and a layer of a linear interlayer-glass paste was at the position of the rear electrode and dried at 250° C. for 2.5 min, wherein the linear interlayer-glass paste layer has a width of 2 mm, a height of 5 μm, and a distance of 30.4 mm between two adjacent linear interlayer-glass pastes; and (2) rear silver electrodes were overprinted on the linear interlayer-glass paste in step (1), and dried at 250° C. for 2 min to give the P-type crystalline silicon rear electrodes, wherein the rear silver electrode has a width of 2 mm, a height of 5 μm, and a distance of 30.4 mm between two adjacent rear electrodes.

Comparative Example 1

Preparation of a blocking layer paste: the blocking layer paste comprised the following components in part by weight: a total of 67 parts of ZrN and TiN having a particle size $D_{50}$ of 0.1 μm, $BN_x$ and $VN_x$ having a particle size $D_{50}$ of 0.3 μm, $Al_2O_3$ and $SiO_2$ having a particle size $D_{50}$ of 0.3 μm, 3 parts of a lead-free glass powder having a $D_{50}$ of 0.7

μm and a softening point of 500° C., 29.8 parts of an organic binder and 0.2 parts of an organic auxiliary agent. The pre-dispersed metal nitride and oxide powders, organic binder, inorganic binder and organic auxiliary agent were dispersed and mixed according to certain ratios, and ground 6 times by using a three-roll mill for uniform dispersion to give a blocking layer paste having a fineness of less than 15 μm.

Preparation of rear silver paste used in combination with blocking layer paste: the rear silver paste comprised the following components in part by weight: 42 parts of a special hollow spherical silver powder having purity of more than 99.99%, 15 parts of a flake silver powder, 2.5 parts of a lead-free glass powder, 40.1 parts of an organic binder and 0.4 parts of an organic auxiliary agent, wherein the hollow spherical silver powder has a particle size $D_{50}$ of 1 μm, the flake silver powder has a particle size $D_{50}$ of 6 μm. The silver powder, organic binder, inorganic binder and organic auxiliary agent were dispersed and mixed according to certain ratios, and ground 6 times by using a three-roll mill for uniform dispersion to give a rear silver paste having a fineness of less than 15 μm used in combination with the blocking layer paste.

Method for preparing rear electrode of solar cell: a layer of the conductive blocking layer paste was printed or sprayed on the rear aluminum paste, the blocking layer paste being directly printed on the rear aluminum electrodes, After drying, the rear silver paste used in combination was printed on the blocking layer paste. After drying, sintering was performed to form the rear electrodes.

The performance analysis of the present invention is as follows:

The cell plates prepared using the methods in Examples 1 to 3 and Comparative Example 1 were tested after sintering for their electric properties, which are shown in Table 1.

TABLE 1

| | Electric properties | | | | | |
|---|---|---|---|---|---|---|
| Item | Open-circuit voltage (V) | Short-circuit current (A) | Series resistance (Ω) | Parallel resistance (Ω) | Fill factor (%) | Conversion efficiency (%) |
| Example 1 | 0.68 | 9.85 | 0.0023 | 2560 | 80.66 | 22.06 |
| Example 2 | 0.67 | 9.84 | 0.0021 | 2648 | 80.97 | 22.16 |
| Example 3 | 0.675 | 9.83 | 0.0020 | 2584 | 80.78 | 22.05 |
| Comparative Example 1 | 0.65 | 9.32 | 0.0029 | 2641 | 78.21 | 21.25 |

As can be seen from Table 1, by using the method disclosed herein, good contact with silver and aluminum is kept without causing damage to the passivation layer and compromising the conductivity. In the present invention, a complete all-aluminum back surface field can be formed, leading to an improved field passivation property of electrode regions and reduced carrier recombination. Besides, no silver entering a silicon substrate avoids electric leakage, thereby reducing leakage current in cells and improving the photoelectric conversion efficiency.

The present invention is not limited to the above-mentioned optimal embodiments, and any other various products may be obtained by anyone in light of the present invention. However, no matter what change in shape or structure thereof is made, all technical schemes that are identical or similar to those of the present invention will fall within the protection scope of the present invention.

What is claimed is:

1. A method for preparing a P-type crystalline silicon rear electrode, comprising performing double-sided texturing on a P-type crystalline silicon, plating a film on a front of the P-type crystalline silicon, plating a rear passivation layer on a rear of the P-type crystalline silicon, grooving on the rear passivation layer, and then preparing front and rear electrodes for the P-type crystalline silicon, wherein
    preparing the rear electrode comprises:
    (1) printing an all-aluminum paste on the rear passivation layer and drying, then printing the all-aluminum paste on the P-type crystalline silicon rear passivation layer and drying at 150-250° C. for 2.5-3.5 min, and printing a layer of a linear interlayer-glass paste at the position of the rear electrode and drying at 150-250° C. for 2.5-3.5 min, wherein the linear interlayer-glass paste layer has a width of 0.6-2 mm, a height of 2-5 μm, and a distance of 13-30.4 mm between two adjacent linear interlayer-glass pastes; and
    (2) overprinting rear silver electrodes on the linear interlayer-glass paste in step (1), and drying at 150-250° C. for 1-2 min to give the P-type crystalline silicon rear electrodes, wherein the rear silver electrode has a width of 0.6-2 mm, a height of 3-8 μm, and a distance of 13-30.4 mm between two adjacent rear electrodes.

2. The method for preparing a P-type crystalline silicon rear electrode according to claim 1, wherein the linear interlayer-glass paste in step (1) is prepared by mixing a bismuth-boron-zinc-vanadium glass powder and an organic vehicle; based on 100 wt % of the linear interlayer-glass paste, the weight of the bismuth-boron-zinc-vanadium glass powder is 30-50%, and the weight of the organic vehicle is 50-70%.

3. The method for preparing a P-type crystalline silicon rear electrode according to claim 2, wherein based on 100 wt % of the bismuth-boron-zinc-vanadium glass powder, the bismuth-boron-zinc-vanadium glass powder is prepared by fusion of 10-40 wt % of bismuth oxide, 5-25 wt % of boron oxide, 5-25 wt % of zinc oxide, 10-35 wt % of vanadium oxide, 4-8 wt % of strontium carbonate and 0-4 wt % of gallium oxide.

4. The method for preparing a P-type crystalline silicon rear electrode according to claim 2, wherein the bismuth-boron-zinc-vanadium glass powder has a vitrification transition temperature of 300-400° C. and a median particle size $D_{50}$ of 2-3 μm.

5. The method for preparing a P-type crystalline silicon rear electrode according to claim 2, wherein based on 100 wt % of the organic vehicle, the organic vehicle comprises 10-30 wt % of an organic resin, 60-80 wt % of an organic solvent and 5-15 wt % of an organic auxiliary agent.

6. The method for preparing a P-type crystalline silicon rear electrode according to claim 5, wherein the organic resin is at least one selected from ethyl cellulose and butyl acetate cellulose.

7. The method for preparing a P-type crystalline silicon rear electrode according to claim 5, wherein the organic solvent is one or more selected from terpineol, texanol, butyl carbitol, butyl carbitol acetate and glycerol.

8. The method for preparing a P-type crystalline silicon rear electrode according to claim 5, wherein the organic auxiliary agent is at least one selected from stearic acid and a stearic acid derivative, an unsaturated fatty acid, a modified hydrogenated castor oil and a polyamide wax.

9. The method for preparing a P-type crystalline silicon rear electrode according to claim 1, wherein the rear silver electrode in step (2) is prepared by mixing, grinding and dispersing a flake silver powder, a lead-boron-zinc-barium glass powder and an organic vehicle; based on 100 wt % of the rear silver electrode, the weight of the flake silver powder is 60-80 wt %, the weight of the lead-boron-zinc-barium glass powder is 10-15 wt %, and the weight of the organic vehicle is 5-20 wt %; the flake silver powder has a median particle size $D_{50}$ of 5-6 μm, and the lead-boron-zinc-barium glass powder has a vitrification transition temperature of 350-450° C. and a median particle size $D_{50}$ of the lead-boron-zinc-barium glass powder is 0.5-1 μm.

10. The method for preparing a P-type crystalline silicon rear electrode according to claim 9, wherein based on 100 wt % of the lead-boron-zinc-barium glass powder, the lead-boron-zinc-barium glass powder is prepared by fusion of 50-60 wt % of lead oxide, 10-30 wt % of boron oxide, 5-20 wt % of zinc oxide and 1-10 wt % of barium oxide.

\* \* \* \* \*